United States Patent
Bangert

(10) Patent No.: US 7,369,426 B2
(45) Date of Patent: May 6, 2008

(54) MAGNETORESISTIVE MEMORY CELL WITH DYNAMIC REFERENCE LAYER

(75) Inventor: Joachim Bangert, Erlangen (DE)

(73) Assignee: Infineon Technologies AG, Munich (DE)

( * ) Notice: Subject to any disclaimer, the term of this patent is extended or adjusted under 35 U.S.C. 154(b) by 484 days.

(21) Appl. No.: 10/497,007

(22) PCT Filed: Nov. 25, 2002

(86) PCT No.: PCT/DE02/04323

§ 371 (c)(1),
(2), (4) Date: Dec. 15, 2004

(87) PCT Pub. No.: WO03/049120

PCT Pub. Date: Jun. 12, 2003

(65) Prior Publication Data

US 2005/0116308 A1    Jun. 2, 2005

(30) Foreign Application Priority Data

Nov. 30, 2001  (DE) ............... 101 58 795

(51) Int. Cl.
*G11C 11/00* (2006.01)
(52) U.S. Cl. ............ 365/158; 365/173; 365/171; 365/130
(58) Field of Classification Search ........... 365/158, 365/171, 173, 130
See application file for complete search history.

(56) References Cited

U.S. PATENT DOCUMENTS

| | | | | |
|---|---|---|---|---|
| 5,686,838 A | * | 11/1997 | van den Berg | 324/252 |
| 6,233,172 B1 | | 5/2001 | Chen et al. | |
| 6,404,674 B1 | * | 6/2002 | Anthony et al. | 365/173 |
| 6,436,526 B1 | | 8/2002 | Odagawa et al. | |
| 7,193,889 B2 | * | 3/2007 | Sharma | 365/158 |
| 2003/0057461 A1 | * | 3/2003 | Tran et al. | 257/295 |
| 2003/0058684 A1 | * | 3/2003 | Tran et al. | 365/158 |

FOREIGN PATENT DOCUMENTS

| | | |
|---|---|---|
| DE | 600 13 079 T2 | 1/2005 |
| EP | 0 875 901 A | 11/1998 |
| EP | 1 109 168 B1 | 6/2001 |
| EP | 1 061 592 A3 | 9/2001 |
| EP | 1 296 331 A | 3/2003 |
| JP | 09045074 A | 2/1997 |
| JP | 11-003585 | 1/1999 |
| JP | 2000-090658 A | 3/2000 |
| JP | 2001-237472 | 8/2001 |
| JP | 2001-250999 | 9/2001 |
| WO | WO 99/14760 | 3/1999 |

* cited by examiner

*Primary Examiner*—Richard T. Elms
*Assistant Examiner*—Eric Wendler
(74) *Attorney, Agent, or Firm*—Slater & Matsil, L.L.P.

(57) ABSTRACT

The present invention relates to an arrangement for increasing a relative change in resistance of a magnetoresistive memory cell (17) having in each case a memory layer (1) and a reference layer (3) on both sides of a tunnel barrier (2), the reference layer (3) being fashioned as a magnetically soft layer, and the magnetization thereof, which can be influenced by write operations, being oriented correctly again by a reference backup field or a reference magnetization current (11).

12 Claims, 2 Drawing Sheets

MAGNETORESISTIVE MEMORY CELL WITH DYNAMIC REFERENCE LAYER

BACKGROUND

1. Field

The following relates to an arrangement for increasing a relative difference in resistance of a magnetoresistive memory cell having in each case a memory layer and a reference layer on both sides of a tunnel barrier between a first magnetization state and a second state.

2. Background Information

A magnetoresistive memory cell usually comprises two ferromagnetic systems with a non-ferromagnetic isolating layer situated in between. In the simplest case, the two systems comprise a ferromagnetic layer in each case.

The first ferromagnetic layer is typically made of a hard-magnetic material, for instance a cobalt-iron alloy. This ferromagnetic layer, with a constant magnetization in terms of magnitude and direction, functions as a reference layer.

The second ferromagnetic layer made of a soft-magnetic material, typically a nickel-iron alloy, forms a memory layer. In a manner corresponding to a data content of the memory cell, the magnetization of the memory layer is oriented unidirectionally or oppositely directed with respect to the magnetization of the reference layer. The memory cell thus has two distinguishable magnetization states (unidirectional, oppositely directed) in accordance with its data content.

If the magnetoresistive memory cell is based on the tunnel effect, then the material of the isolating layer is a dielectric. The frequency of a transition of electrons from one ferromagnetic layer to the other is higher in the case of unidirectional magnetization of the two ferromagnetic layers than in the case of oppositely directed magnetization of the two layers. From the conductivity of the layer system, it is possible to deduce the orientation of the magnetization of the memory layer relative to the magnetization of the reference layer and thus the data content of the memory cell.

The more pronounced the difference in conductivity or electrical resistance for the two magnetization states of the magnetoresistive memory cell, the higher the degree of interference immunity with which, and more simply, the data content of the memory cell can be read out. The difference in resistance behavior becomes greater, the fewer magnetic domain regions the two ferromagnetic layers have and the higher the spin polarization within the two layers.

In the known art, the difference in resistance for the two magnetization states is 15-20%, for example, in the case of magnetoresistive memory cells based on the tunnel effect. In a semiconductor device having magnetoresistive memory cells, by contrast, the resistance of two adjacent memory cells in the semiconductor device with the same magnetization state can also be significantly more than 20%. The conductivity thus diverges between two memory cells of equal magnetization with the same order of magnitude as between the two magnetization states of a memory cell. This makes it considerably more difficult to evaluate the magnetization state and assess the data content of a memory cell.

In conventional concepts for the reference layer of a magnetoresistive memory cell, the reference layer is designed as a magnetically hard layer which receives its magnetization in the course of a fabrication process for a semiconductor device having a magnetoresistive memory cell and essentially retains it for an entire service life of the semiconductor device. Temperature and long-term data stability of the magnetoresistive memory cell depend directly on the stability of the magnetization of the reference layer.

In present concepts, the reference layer is either coupled (pinned) to natural antiferromagnetic layers or supplemented with at least one further ferromagnetic layer of oppositely directed magnetization to form an artificial antiferromagnet. Ferromagnetic and antiferromagnetic systems that are coupled to such an extent via the Rudermann-Kittel-Kasuya-Yoshida (RKKY) interaction have an improved temperature and long-term data stability compared with individual hard-magnetic layers and are less sensitive to interfering magnetic fields.

FIG. 3 illustrates a diagrammatic cross section through a magnetoresistive memory cell. A reference system 6 and a memory system, which in this case comprises an individual memory layer 1, lie opposite one another on both sides of a tunnel barrier 2. The reference layer 3 is a sublayer of the reference system 6 which is oriented towards the tunnel barrier 2. In this case, the reference system 6 is fashioned as an artificial antiferromagnetic layer system (AAF), comprising the reference layer 3 and a reference coupling layer 5 on both sides of a spacer layer (a spacer) 4, a magnetization 9 of the reference coupling layer 5 being oppositely directed with respect to a reference magnetization 8 of the reference layer 3.

In a similar manner, the reference layer 3 (then as pinned layer) can be coupled via the spacer 4 to another layer (pinning layer) made of a naturally antiferromagnetic material. Such concepts are known from magnetic sensors and, in particular, from magnetic read/write heads.

A plurality of coupling mechanisms, for instance Néel interaction (orange peel coupling), pinhole coupling and interactions via magnetic leakage fields, act between the reference layer 8 or the reference system 6 and the memory layer 7.

Layers that are strongly coupled to one another react more sluggishly with respect to a magnetization reversal than weakly coupled systems. Therefore, present-day concepts for reference systems attempt to reduce the magnitudes of these interactions in order to obtain better dynamic properties of the magnetoresistive memory cell.

Secondly, a bias field resulting from the sum of the interactions, in the memory layer of the magnetoresistive memory cell, leads to an asymmetrical switching behaviour of the memory layer. Therefore, the present concepts attempt to achieve compensation of the magnetic coupling mechanisms at the location of the memory layer.

To summarize, the following, partly conflicting requirements result for the reference layer, or a reference layer system: (i) temperature stability, long-term data stability and magnetic field insensitivity each require a thick and magnetically hard reference layer; (ii) a low magnitude of the Néel coupling requires a thick memory layer; and (iii) a symmetrical switching behavior of the memory layer presupposes a reliably reproducible surface roughness of the reference layer and an adjustable leakage field.

SUMMARY

An arrangement is disclosed for increasing a difference in resistance of a magnetoresistive memory cell in a semiconductor device. The arrangement comprises a memory layer, a reference layer having a magnetically soft layer and has a high spin polarization, and a tunnel barrier separating the memory layer from the reference layer. When the memory cell is in a first magnetization state, the magnetization of the memory layer is unidirectional with respect to a reference magnetization of the reference layer, and when in a second state, the magnetization is oppositely directed with respect to the reference magnetization. In the event of a changeover of the magnetization of the memory layer, a deflection or changeover of the magnetization of the reference layer is permissible, and the orientation of the magnetization of the reference layer can be set in the direction of the reference magnetization before a next read operation on the magnetoresistive memory cell given unaltered orientation of the magnetization of the memory layer.

A method is also disclosed for operating a magnetoresistive memory cell, having in each case a memory layer and a magnetically soft reference layer on both sides of a tunnel barrier in a semiconductor device. This includes the steps of orienting the magnetization of the memory layer of the magnetoresistive memory cell in accordance with a datum to be stored, whereby a reference magnetization of the reference layer can be deflected, reestablishing the reference magnetization of the reference layer, and reading out the datum of the magnetoresistive memory cell.

Further advantages, features and details of the invention emerge from the exemplary embodiments described below.

BRIEF DESCRIPTION OF THE FIGURES

The invention is explained in more detail below with reference to the drawings, identical reference symbols being used for mutually corresponding structural parts and components. In the figures.

DETAILED DESCRIPTION

Figure 1A:
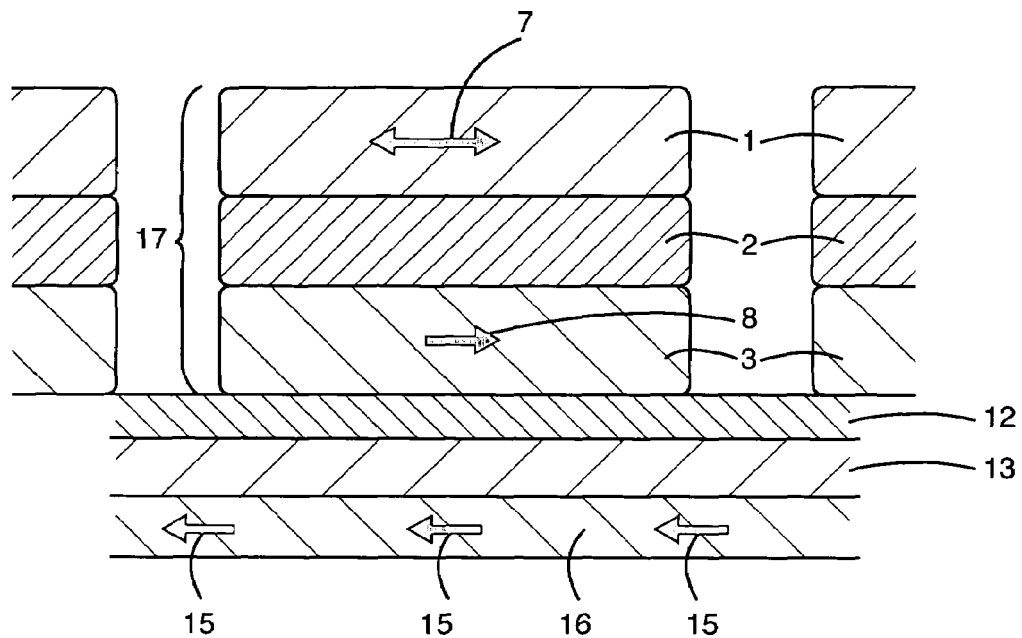
FIGS. 1a and 1b illustrate diagrammatic cross-sections through magnetoresistive memory cells according to a first and a second exemplary embodiment of the invention.

The following symbols and elements are used consistently throughout the text and drawings:
 1 Memory layer
 2 Tunnel barrier
 3 Reference layer
 4 Spacer layer (spacer)
 5 Reference coupling layer
 6 Reference system
 7 Magnetization of the memory layer
 8 Reference magnetization
 9 Magnetization of the reference coupling layer
 10 Interconnect
 11 Reference magnetization current
 12 Passivation layer
 13 Dielectric layer
 14 Local reference backup system
 15 Reference backup magnetization
 16 Distributed reference backup layer
 17 Magnetoresistive memory cell
 18 Reference backup spacer layer
 19 Reference backup coupling layer
 20 Local reference backup layer
 21 Magnetization of the reference backup coupling layer The following describes an arrangement that increases a difference in resistance in a magnetoresistive memory cell for two different magnetization states, and a method by which such an arrangement can be operated.

In accordance with an embodiment of the present invention, a reference layer of a magnetoresistive memory cell situated in a semiconductor device is embodied as a magnetically soft layer. This is done by means of a realization made of a soft-magnetic material, such as a nickel-iron alloy. Furthermore, the reference layer can also be made thin. The reference layer then contains no or few domains and a high spin polarization is present.

When writing to the memory cell, write currents in address lines of the memory cell generate magnetic fields which are strong enough to reliably change over the magnetization of a memory layer of the memory cell, if necessary. Since the soft-magnetic reference layer is at a distance of only a few nanometers from the memory layer, the magnetization thereof is also influenced and deflected, if appropriate oriented counter to an orientation of the reference magnetization, by the magnetic fields generated by the write currents.

A subsequent read-out of the memory cell will then always yield the parallel, low-resistance data content, since a reading system of the memory cell can only identify the relative orientation of the magnetizations of memory layer and reference layer (parallel/antiparallel) and, after writing, both layers are always oriented in the same way.

It must thus be ensured that the original reference magnetization is reestablished in the reference layer after the process of writing to the memory cell.

This is done with the aid of a magnetic backup field. Since the distance between reference layer and memory layer is only a few nanometers in present structures, a backup field acting on the reference layer also acts on the memory layer, the orientation of which must always be preserved, however, independently of the backup field.

This is ensured by a suitable choice of the cohesive field strength of the reference layer relative to the cohesive field strength of the memory layer. The cohesive field strength of the memory layer is usually prescribed by the write currents that are possible for the semiconductor device.

The backup field is designed such that, on the one hand, a proportion that is still active in the memory layer is significantly smaller than the cohesive field strength of the memory layer in order to ensure sufficient interference immunity in the case of anti-parallel orientation of the backup field and the magnetization of the memory layer. On the other hand, the backup field must be large enough to reliably orient the reference layer. That also comprises a sufficient stability against external dynamic interference fields.

It emerges for the cohesive field strength of the reference layer that, on the one hand, it must be significantly lower than the backup field at the location of the reference layer in order to be able to be reliably controlled by this. For the case of a temporary backup field which is absent during a read operation, the cohesive field strength of the reference layer should, on the other hand, still be large enough to enable a stable read operation, that is to say strong enough to respond sufficiently sluggishly to external dynamic interference fields. The cohesive field strength of the reference layer can be chosen to be smaller for the same stability against external fields if a steady-state backup field or a temporary backup field which is active during the read operation is added vectorally to the reference magnetization during the read operation.

Preferred values for the cohesive field strengths in customary structures for magnetoresistive memory cells are 3 kA/m for the memory layer and 0.5 kA/m for the reference layer. The backup field should then have 0.8 kA/m, for example.

The backup magnetic field can be generated in various ways. In a first preferred embodiment, the magnetization of the reference layer is oriented by a reference magnetization current in an interconnect routed near the reference layer. In this case, the reference magnetization current is present only for a short period of time. The current pulse can be bound either to a write operation subsequent to which it is effected, or to a read operation, it being triggered shortly before and/or during the read operation. This last results in a higher stability against external interfering fields.

The current pulse can always be effected purely locally, that is to say relative to the memory cell that is currently being written to or is forthwith to be read. The interconnect may then be an interconnect which is required anyway and is modified in such a way that it conducts the current pulse in addition to its original function. However, it is also possible to provide interconnects that are dedicated for this purpose.

In both cases, it is possible to reduce the circuitry outlay to the detriment of a higher power consumption by the current pulse not being addressed individually, but rather addressing groups of memory cells simultaneously.

In a second preferred embodiment of the invention, the semiconductor device is provided with at least one hard-magnetic reference backup system which is isolated from the magnetically soft reference layer by at least one non-ferromagnetic layer.

In the simplest case, the reference backup system comprises a reference backup layer which carries a reference backup magnetization opposite to the reference magnetization. In this embodiment of the invention, the magnetization of the reference layer is automatically oriented to the reference magnetization again after every deflection from the direction of the reference magnetization.

A reference backup system can be realized locally, that is to say individually for each memory cell.

In a preferred embodiment of the invention, however, the reference backup system is applied as a simple reference backup layer over an entire cross-sectional area of the semiconductor device, which area is parallel to the reference layers. Consequently, a backup field that is largely homogeneous at the location of the reference layers is generated in a simple manner.

Such a reference backup layer can be provided within and outside the semiconductor device.

If a reference backup layer is applied within a semiconductor device, then this is preferably done at the wafer level by means of the technologies that are customary for processing a wafer and with the materials used in the fabrication of the memory cells, for instance a cobalt-iron alloy. The magnetic properties of such a reference backup layer can be influenced in a targeted manner by structuring of the reference backup layer.

Within the semiconductor device, it is possible to apply the reference backup layer below the memory cells, in a manner isolated from a subsequent passivation layer for instance by a dielectric layer.

In the case of semiconductor devices having a plurality of memory cell planes, each memory cell plane may in each case be assigned at least one reference backup layer which is magnetized in response to the specific requirements of the respective memory cell plane. In this case, memory cell planes and reference backup layers alternate in the layer construction of the semiconductor device. In this case, it is also possible for a reference backup layer to be assigned to at least two memory cell planes which lie opposite one another in each case at the reference backup layer.

If the reference backup layer is applied during or after a process of housing the semiconductor device, then in this context it is held to be a reference backup layer outside the semiconductor device. Such a reference backup layer is then assigned jointly to all the memory cell planes.

Such a solution is the use of housings made of a ferromagnetic material or the positioning of the semiconductor device on a suitable carrier.

A preferred embodiment of the arrangement according to the invention for a reference backup layer applied outside the semiconductor device is a premagnetized lamina or a premagnetized film, which are preferably applied on at least one surface of the semiconductor device which is parallel to the reference layer.

In any event, an arrangement that is provided for screening the semiconductor device from external fields can also be utilized as reference backup layer or, alternatively, the reference backup layer can be utilized as a screen of the semiconductor device.

In order to generate a backup field that is homogeneous over all the memory cells, the reference backup layer is preferably applied over an entire cross-sectional area of the semiconductor device, which area is parallel to the memory layers.

Subsequent structuring of the reference backup layer enables the fine adjustment of a compensation field in the memory layer.

The magnetic stability of the reference backup system shapes the temperature and long-term data stability of the magnetoresistive memory cell. Accordingly, in a further preferred embodiment of the invention, the reference backup system is embodied as a magnetically hard layer system.

To that end, the reference backup layer is coupled via a reference backup spacer layer made of a conductive, non-magnetic material (typically a noble metal such as ruthenium, gold, copper, palladium, platinum, osmium, mercury or rhodium) to a reference backup coupling layer made of a ferromagnetic material (typically a cobalt-iron alloy) with an antiparallel magnetization (AAF) with respect to the magnetization of the reference backup layer, or to a layer made of a naturally antiferromagnetic material. As a result of an interaction described by Rudermann, Kittel, Kasuya and Yoshida, the spin polarizations bond in the two layers on both sides of the reference backup spacer layer. The reference backup layer becomes magnetically stable in this way.

If the ferromagnetic sublayers of a reference backup system that lie opposite at the reference backup spacer layer become asymmetrical, that is to say are provided with a different layer thickness, then the reference backup system has a net moment (leakage field hereinafter). The leakage field becomes the backup field of the reference layer.

Given suitable dimensioning, the backup field can also be used to compensate for a bias field which is active in the memory layer on account of different coupling mechanisms.

Thus, in a magnetoresistive memory cell with a magnetically soft reference layer, the spin polarization in the reference layer is significantly increased compared with a conventional construction with a hard-magnetic reference layer. The two states of the memory cell, that is to say parallel or antiparallel orientation of the magnetizations of memory layer and reference layer in accordance with the binary data content of the memory cell, can be distinguished more easily. An outlay to be provided on the semiconductor device for a circuit which measures and assesses the electrical resistance of the memory cell is reduced and the interference immunity is increased.

In an arrangement according to the invention, the reference layer is influenced by the magnetic fields of write currents which control the magnetization of the memory layer. If the memory layer is magnetized counter to the reference magnetization during a write operation, then the magnetic field generated by the write current also acts counter to the reference magnetization. The magnetization of the reference layer is reversed in this case. Since a data content is assessed according to the relative orientation of the magnetizations in the memory layer and reference layer but is stored in the form of the orientation of the magnetization of the memory layer, measures apply to reestablish the reference magnetization.

Thus, according to the method according to the invention, the reference magnetization is reestablished in the reference layer by a reference backup field before the magnetoresistive memory cell is read. The influencing of the reference magnetization by a write operation can thus be accepted.

A mechanism (reference reset) for reestablishing the reference magnetization of the reference layer is effected independently of the datum read in, either after a write operation or before each read operation. Said mechanism is based on known effects such as, for example, magnetostatics, Néel coupling or pinhole coupling.

In a preferred embodiment of the method according to the invention, the reference reset is effected before each read operation. For the read operation, methods are chosen in which the reference magnetization can be destroyed in a manner similar to that during a write operation. Such methods afford better distinguishability of the two states of the memory cell.

In a first preferred embodiment of the invention, the reference backup field is generated as a static reference backup field of a hard-magnetic reference backup system within or outside the semiconductor device.

In a second preferred embodiment, the reference backup field is generated by a reference magnetization current. For the reference magnetization current, in a passivation layer adjoining the reference layer, an interconnect is provided or the circuitry of an interconnect that is already present is adapted for this purpose.

In this embodiment of the invention, the cohesive field strength of the reference layer is designed in such a way that the reference magnetization is stable with respect to the leakage field of the magnetized memory layer.

The invention is explained in more detail below with reference to the drawings, the same reference symbols being used for mutually corresponding components.

The two drawings in FIG. 1 show two simplified cross sections through a semiconductor device having magnetoresistive memory cells 17, which cross sections are not true to scale and are restricted to the illustration of the features that are essential to the invention.

A memory cell 17 comprises in each case a memory layer 1 and a reference layer 3 on both sides of a tunnel barrier 2. The reference layer 3 carries the reference magnetization 8. The magnetization 7 of the memory layer 1 is parallel or antiparallel with respect to the reference magnetization 8, in accordance with the data content of the memory cell 17.

A passivation layer (interconnect layer) 12 usually adjoins the reference layer 3 in a manner lying opposite to the tunnel barrier 2. The passivation layer 12, for its part, is applied on a dielectric layer 13.

In FIG. 1a, the reference backup system is fashioned as a distributed reference backup layer 16. The magnetically hard reference backup layer 16 carries a reference backup magnetization 15 directed oppositely to the reference magnetization 8. A leakage field coupling active between the reference backup layer 16 and the reference layer 3 acts in the direction of an antiparallel orientation of the magnetizations and rotates a magnetization of the reference layer 3, said magnetization having been deflected from the direction of the reference magnetization 8, back in the direction of the reference magnetization 8.

Figure 1B:
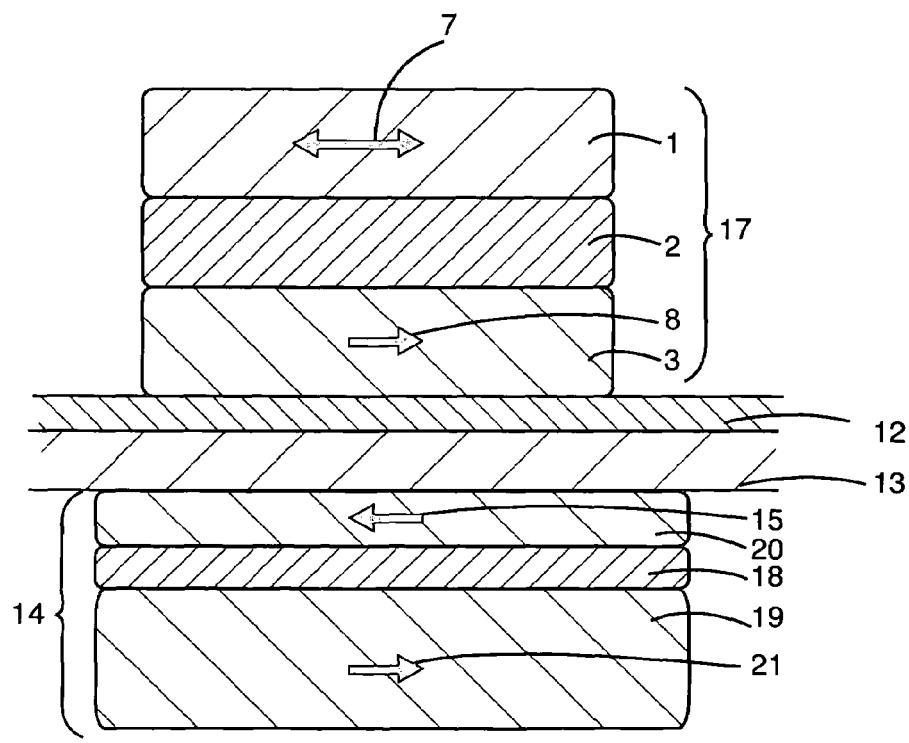

In FIG. 1b, a local reference backup system 14 lies opposite to the reference layer 3 at the dielectric layer 13. In this case, the local reference backup system 14 extends over a region that is respectively assigned to a memory cell 17. In this case, the reference backup system 14 is formed from a local ferromagnetic reference backup layer 20 and an antiferromagnetic reference backup coupling layer 19 with a magnetization 21 on both sides of a non-magnetic reference backup spacer layer 18. The magnetizations 20, 21 are fixedly coupled to one another via the RKKY interaction. If the magnitudes of the magnetizations 20, 21 deviate from one another, then the local reference backup system 14 forms a leakage field (net moment) which becomes the backup field for the reference magnetization 8 and can be used to achieve a compensation of the Néel interaction between the memory layer 1 and the reference layer 3.

A writing magnetic field, which is generated by write currents and switches the magnetization 7 of the memory layer 1 from a parallel state with respect to the reference magnetization 8 into an antiparallel state, also acts in the same way on the magnetization of the reference layer 3.

Although the distance between the latter and the source of the writing magnetic field is larger and so the effective magnetic field is also smaller, nevertheless the cohesive field strength of the magnetically soft reference layer 3 is significantly lower.

The magnetization of the reference layer 3 can rotate from the antiparallel orientation with respect to the reference backup magnetization 15 into a parallel orientation.

After the writing magnetic field has decayed, only the leakage field couplings of the memory layer 1 and the reference backup layer 16 or the reference backup system 14 act on the reference layer 3, the leakage field coupling (the backup field) of the reference backup layer 16 or of the reference backup system 14 being predominant.

Since the backup field which is active in the reference layer 3 is stronger than the cohesive field strength of the magnetically soft reference layer 3, the magnetization of the reference layer 3 rotates in the direction of the reference magnetization 8 again.

Figure 2:
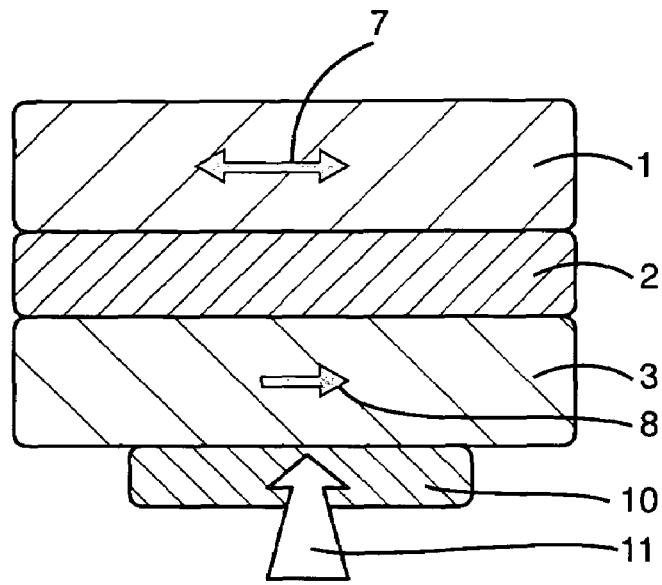
FIG. 2 illustrates a diagrammatic cross-section through a magnetoresistive memory cell according to a third exemplary embodiment of the invention.
Figure 3:
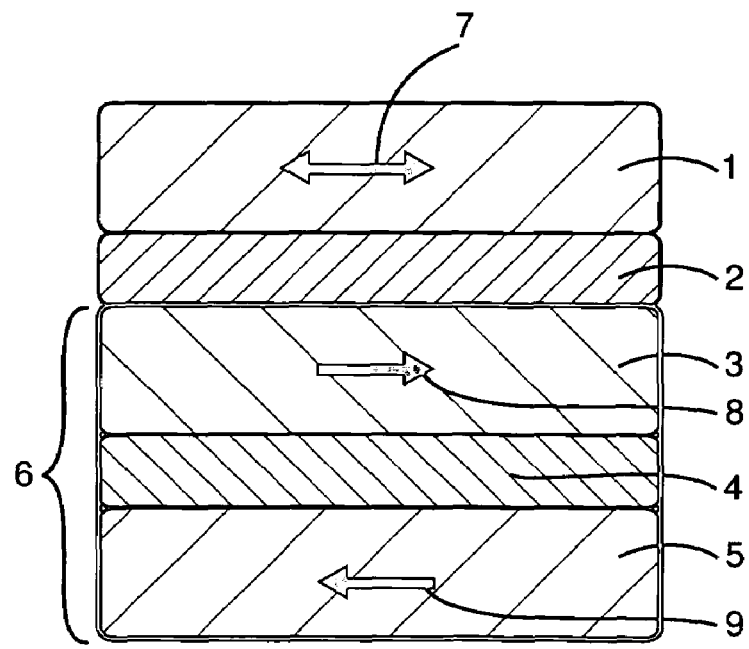
FIG. 3 illustrates a diagrammatic cross section through a conventional magnetoresistive memory cell.

FIG. 2 illustrates a second embodiment of the invention in a simplified cross section through a magnetoresistive memory cell 17.

The memory cell 17 comprises in each case a memory layer 1 and a reference layer 3 on both sides of a tunnel barrier 2. The reference layer 3 carries the reference magnetization 8. The magnetization 7 of the memory layer 1 is parallel or antiparallel with respect to the reference magnetization 8, in accordance with the data content of the memory cell 17.

In an interconnect 10, which, in this example, is arranged at a surface of the reference layer 3 which is opposite to the tunnel barrier 2, a reference magnetization current 11 flows before and/or during a read operation at the memory cell 17 in the direction of the arrow. The magnetic field generated by the reference magnetization current 11 acts in the direction of the reference magnetization.

In this case, the cohesive field strength of the reference layer 3 is sufficiently large with respect to the leakage field of the memory layer 1.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

What is claimed is:

1. An arrangement for increasing a difference in resistance of a magnetoresistive memory cell in a semiconductor device, comprising:
   a memory layer;
   a reference layer having a magnetically soft layer and a high spin polarization; and
   a tunnel barrier separating the memory layer from the reference layer,
   wherein, when the memory cell is in a first magnetization state, the magnetization of the memory layer is unidirectional with respect to a reference magnetization of the reference layer, and when in a second state, the magnetization is oppositely directed with respect to the reference magnetization, and
   in the event of a changeover of the magnetization of the memory layer, a deflection or changeover of the magnetization of the reference layer is permissible, and the orientation of the magnetization of the reference layer can be set in the direction of the reference magnetization before a next read operation on the magnetoresistive memory cell given unaltered orientation of the magnetization of the memory layer.

2. An arrangement for increasing a difference in resistance of a magnetoresistive memory cell in a semiconductor device, comprising:
   a memory layer;
   a reference laser having a magnetically soft layer and a high spin polarization;
   a tunnel barrier separating the memory layer from the reference layer,
   wherein, when the memory cell is in a first magnetization state, the magnetization of the memory layer is unidirectional with respect to a reference magnetization of the reference layer, and when in a second state, the magnetization is in an opposite direction with respect to the reference magnetization;
   an interconnect for providing the reference magnetization current for generating the reference magnetization in the reference layer;
   in the event of a changeover of the magnetization of the memory layer, a deflection or changeover of the magnetization of the reference layer is permissible, and the orientation of the magnetization of the reference layer can be set in the direction of the reference magnetization before a next read operation on the magnetoresistive memory cell given unaltered orientation of the magnetization of the memory layer; and
   an interconnect, in which, before the read operation, the reference magnetization current flows, which can generate the reference magnetization in the reference layer.

3. An arrangement for increasing a difference in resistance of a magnetoresistive memory cell in a semiconductor device, comprising:
   a memory layer;
   a reference layer having a magnetically soft layer and has a high spin polarization;
   a tunnel barrier separating the memory layer from the reference layer;
   wherein when the memory cell is in a first magnetization state, the magnetization of the memory layer is unidirectional with respect to a reference magnetization of the reference layer, and when in a second state, the magnetization is in an opposite direction with respect to the reference magnetization;
   in the event of a changeover of the magnetization of the memory layer, a deflection or changeover of the magnetization of the reference layer is permissible, and the orientation of the magnetization of the reference layer can be set in the direction of the reference magnetization before a next read operation on the magnetoresistive memory cell given unaltered orientation of the magnetization of the memory layer; and
   a magnetically hard reference backup system on the side of the reference layer that is opposite to the tunnel barrier, the back up system isolated from the reference layer by at least one non-magnetic layer and having a reference backup magnetization, for generating the reference magnetization in the reference layer.

4. The arrangement according to claim 3, wherein the semiconductor device comprises a plurality of magnetoresistive memory cells, the arrangement further comprising a local reference backup system assigned to each magnetoresistive memory cell within the semiconductor device.

5. The arrangement according to claim 3, wherein the reference backup system is fashioned as a distributed reference backup layer, which runs parallel to the reference layer and at the same time essentially extends over an entire cross-sectional area of the semiconductor device.

6. The arrangement according to claim 5, wherein the distributed reference backup layer is situated outside the semiconductor device.

7. The arrangement according to claim 5, wherein the reference backup layer is structured for a fine adjustment of leakage fields in the memory layer.

8. The arrangement according to claim 5, further comprising a reference backup coupling layer, which is isolated from the reference backup layer by a reference backup spacer layer and fixes the magnetization of a local reference backup layer.

9. The arrangement according to claim 8, wherein the reference backup coupling layer carries a magnetization and the reference backup layer carries a magnetization with a magnitude that is not the same, and a resultant leakage field of the local reference backup system is used to compensate for a remanent Néel interaction between the memory layer and the reference layer to symmetrize a switching behavior of the memory layer.

10. A method for operating a magnetoresistive memory cell having in each case a memory layer and a magnetically soft reference layer on both sides of a tunnel barrier in a semiconductor device, comprising:
    orienting the magnetization of the memory layer of the magnetoresistive memory cell in accordance with a datum to be stored, whereby a reference magnetization of the reference layer can be deflected;
    reestablishing the reference magnetization of the reference layer, and
    reading out the datum of the magnetoresistive memory cell.

11. The method according to claim 10, wherein the reference magnetization of the reference layer can be changed during the read-out of the magnetoresistive memory cell.

12. A method for operating a magnetoresistive memory cell having a memory layer and a magnetically soft reference layer on both sides of a tunnel barrier in a semiconductor device, comprising:

orienting the magnetization of the memory layer of the magnetoresistive memory cell in accordance with data to be stored, whereby a reference magnetization of the reference layer can be changed;

controlling the reference magnetization current in an interconnect near the reference layer and reestablishing the reference magnetization of the reference layer; and reading out the datum of the magnetoresistive memory cell.

* * * * *

UNITED STATES PATENT AND TRADEMARK OFFICE
CERTIFICATE OF CORRECTION

PATENT NO. : 7,369,426 B2  Page 1 of 1
APPLICATION NO. : 10/497007
DATED : May 6, 2008
INVENTOR(S) : Bangert It is certified that error appears in the above-identified patent and that said Letters Patent is hereby corrected as shown below:

On the Title Page, Section (56) References Cited, OTHER DOCUMENTS, 1$^{st}$ entry, insert --COPY OF INTERNATIONAL SEARCH REPORT DATED DECEMBER 2, 2003--.

On the Title Page, Section (56) References Cited, OTHER DOCUMENTS, 2$^{nd}$ entry, insert --COPY OF GERMAN OFFICE ACTION DATED AUGUST 19, 2002--.

Signed and Sealed this

Fifteenth Day of July, 2008

JON W. DUDAS
*Director of the United States Patent and Trademark Office*